United States Patent [19]

Rellick

[11] Patent Number: 4,806,188

[45] Date of Patent: Feb. 21, 1989

[54] METHOD FOR FABRICATING MULTILAYER CIRCUITS

[75] Inventor: Joseph R. Rellick, Wilmington, Del.

[73] Assignee: E. I. Du Pont de Nemours and Company, Wilmington, Del.

[21] Appl. No.: 164,452

[22] Filed: Mar. 4, 1988

[51] Int. Cl.[4] ............................................. B32B 31/16
[52] U.S. Cl. ...................................... 156/89; 29/851;
29/852; 174/68.5; 264/58; 264/61; 264/67;
156/253
[58] Field of Search ................... 156/89, 253; 29/851,
29/852; 264/58, 61, 67; 174/68.5

[56] References Cited

U.S. PATENT DOCUMENTS

| | | | |
|---|---|---|---|
| 3,770,529 | 11/1973 | Anderson | 156/89 |
| 4,465,727 | 8/1984 | Fujita et al. | 156/89 |
| 4,504,339 | 3/1985 | Kamehara et al. | 156/89 |
| 4,645,552 | 2/1987 | Vitriol et al. | 156/89 |
| 4,649,125 | 3/1987 | Takeuchi et al. | 156/89 |
| 4,654,095 | 3/1987 | Steinberg | 156/89 |
| 4,655,864 | 4/1987 | Rellick | 156/89 |

*Primary Examiner*—Caleb Weston

[57] ABSTRACT

The invention is directed to a method for fabricating multilayer circuits on rigid substrates using conventional dielectric green tape and thick film conductive pastes while maintaining excellent X-Y dimensional stability.

8 Claims, 2 Drawing Sheets

(a)

(b)

(c),(d)

(e),(f)

(g),(h)

(i)

(j),(k)

(l),(m)

(n),(o)

(p) REPEAT STEPS (i) THROUGH (o) AS DESIRED

METHOD FOR FABRICATING MULTILAYER CIRCUITS

FIELD OF INVENTION

The invention relates to a method for fabricating multilayer circuits using dielectric green tapes to achieve electrical isolation between the layers.

BACKGROUND OF THE INVENTION

An interconnect circuit board is the physical realization of electronic circuits or subsystems from a number of extremely small circuit elements electrically and mechanically interconnected on a substrate. It is frequently desirable to combine these diverse type electronic components in an arrangement so that they can be physically isolated and mounted adjacent one another in a single compact package and electrically connected to each other and/or to common connections extending from the package.

Complex electronic circuits generally require that the circuit be constructed of several layers of conductors separated by insulating dielectric layers. The conductive layers are interconnected between levels by electrically conductive pathways through the dielectric called vias. Such a multilayer structure allows a circuit to be more compact.

One well known method for constructing a multilayer circuit is by sequentially printing and firing thick film conductors and insulating dielectrics on a rigid insulative substrate such as alumnia. The alumina substrate provides mechanical support and also X-Y dimensional stability and facilitates registration to the patterned thick film conductors and dielectric layers. However, the thick film process has a disadvantage in that printing through a screen mesh can result in pinholes or voids in the dielectric layer which can cause shorting between conductor layers. If a thick film dielectric is formulated to allow sufficient flow of the paste during the printing operation and thus to minimize the tendency to form pinholes, then the maintenance of small vias is likely to be compromised by the flow of dielectric paste into the via hole. Also, the repetitive printing and firing steps for each layer are time consuming and expensive.

Another prior art method for constructing multilayer circuits is that of co-firing a multiplicity of ceramic tape dielectrics on which conductors have been printed with metallized vias extending through the dielectric layers to interconnect the various conductor layers. (See Steinberg, U.S. Pat. No. 4,654,095.) These tape layers are stacked in registry and pressed together at a preselected temperature and pressure to form a monolithic structure which is fired at an elevated temperature to drive off the organic binder, sinter the conductive metal and densify the dielectric. This process has the advantage that firing need only be performed once, thus saving fabricating time and labor and limiting the diffusion of mobile metals which could cause shorting between conductors. However, this process has the disadvantage that the amount of shrinkage which occurs on firing may be difficult to control. This dimensional uncertainty is particularly undesirable in large complex circuits and can result in misregistration during subsequent assembly operations.

On the other hand, Vitriol and Brown in U.S. Pat. No. 4,645,552 disclose a process for constructing a multilayer circuit on a rigid substrate which is similar to the thick film process described above in the way that circuit layers of conductors and dielectrics are sequentially added to the circuit and fired. The circuit is fabricated on a rigid, dimensionally stable substrate by a sequence of steps such as the following:

(a) forming a conductor pattern on a dimensionally stable substrate;
(b) forming via holes in a dielectric green tape;
(c) laminating the green tape onto the substrate in registry with the conductor patterns;
(d) firing the substrate, conductor and green tape;
(e) metallizing the top surface of the dielectric tape and filling the vias; and
(f) repeating steps (b) and (e) until the multilayer structure is complete.

Such a process eliminates some of the disadvantages of the thick film multilayer circuit fabrication process because the risks of pinholes and via closure are eliminated due to the fact that green tape is used as a dielectric insulating layer and mechanically punched vias are employed. However, there is a risk that the flexible tape will be distorted in handling after via formation, which may cause misregistration with the conductor pattern on the substrate.

Rellick, in U.S. Pat. No. 4,655,864, discloses a dielectric green tape suitable for lamination onto a rigid substrate. This green tape is used in a process which is similar to the thick film process described above in the way that circuit layers of conductors and dielectric are sequentially added to the circuit and fired. By using a dielectric in tape form, the risk of pinholes and via closure inherent in the thick film process are eliminated. The tape is comprised of glass and refractory oxides dispersed in an organic binder and is especially suitable for laminating onto rigid substrates. The method for forming a multilayer interconnect structure disclosed in this patent, however, also contemplates forming vias in the dielectric tape before lamination with the attendant disadvantages discussed above.

SUMMARY OF THE INVENTION

The general purpose of the invention is to provide a new and improved method for fabricating multilayer circuits using conventional thick film conductive metallizations and dielectric green tapes in such manner that excellent X-Y dimensional stability of the layers is obtained during firing.

The method of the invention is comprised of two basic procedures, in each of which a plurality of alternating thick film conductive layers and laminated dielectric green tape layers containing vias filled with conductive metallization is sequentially fired. In the first of these basic procedures, the method begins by printing a patterned conductive layer onto an electrically insulative substrate. In the second basic procedure, the method begins by laminating a dielectric green tape onto a substrate which can be either electrically conductive or insulating.

In a first aspect, the invention is directed to a method for the fabrication of multilayer circuits comprising the sequential steps of:

(a) providing a dimensionally stable electrically insulative substrate;
(b) applying to the substrate a patterned conductive layer;
(c) firing the patterned conductive layer;

(d) laminating to the fired patterned conductive layer and exposed areas of the substrate a layer of dielectric green tape;
(e) forming vias in selected positions through the layer of dielectric green tape in registration with the fired patterned conductive layer of step (c);
(f) firing the laminated dielectric green tape layer;
(g) filling the vias in the dielectric tape layer with a conductive metallization;
(h) firing the filled vias in the dielectric tape layer;
(i) applying a patterned conductive layer to the dielectric tape layer in registry with the vias therein;
(j) firing the patterned conductive layer; and
(k) in the event the multilayer circuit requires more than two layers having conductive patterns, repeating the sequence of steps (d) through (j) until the desired number of circuit layers has been obtained.

In a second aspect, the invention is directed to a method for the fabrication of multilayer circuits comprising the sequential steps of:
(a) providing a dimensionally stable substrate;
(b) laminating to a surface of the substrate a layer of dielectric green tape;
(c) optionally forming vias in the laminated green tape;
(d) firing the laminated dielectric green tape layer;
(e) filling any vias in the laminated dielectric tape with a conductive metallization;
(f) firing any filled vias in the dielectric tape layer;
(g) applying to the dielectric tape layer a patterned conductive layer;
(h) firing the patterned conductive layer;
(i) laminating a dielectric green tape layer to the fired patterned conductive layer and exposed areas of the underlying dielectric tape layer;
(j) forming vias in the laminated green tape layer of step (i);
(k) firing the laminated green tape layer which was applied in step (j);
(l) filling the vias in the tape layer with a conductive metallization;
(m) firing the filled vias contained in the dielectric tape layer from step (l);
(n) applying to the dielectric tape layer from a patterned conductive layer;
(o) firing the patterned conductive layer from step (n); and
(p) in the event the multilayer circuit requires more than two layers having conductive patterns, repeating the sequence of steps (i) through (o) until the desired number of circuit layers has been obtained.

It will be recognized that in laminating green tape layers to the underlying conductive layers, the green tape is also laminated to at least a selected portion of the underlying substrate, fired tape layers or conductive patterns. This is a function of specific circuit design.

BRIEF DESCRIPTION OF THE DRAWINGS

The drawings consist of two figures, FIGS. 1 and 2, which illustrate schematically the sequential steps of the above-described two principal aspects of the invention.

DETAILED DESCRIPTION OF THE INVENTION

Figure 1:
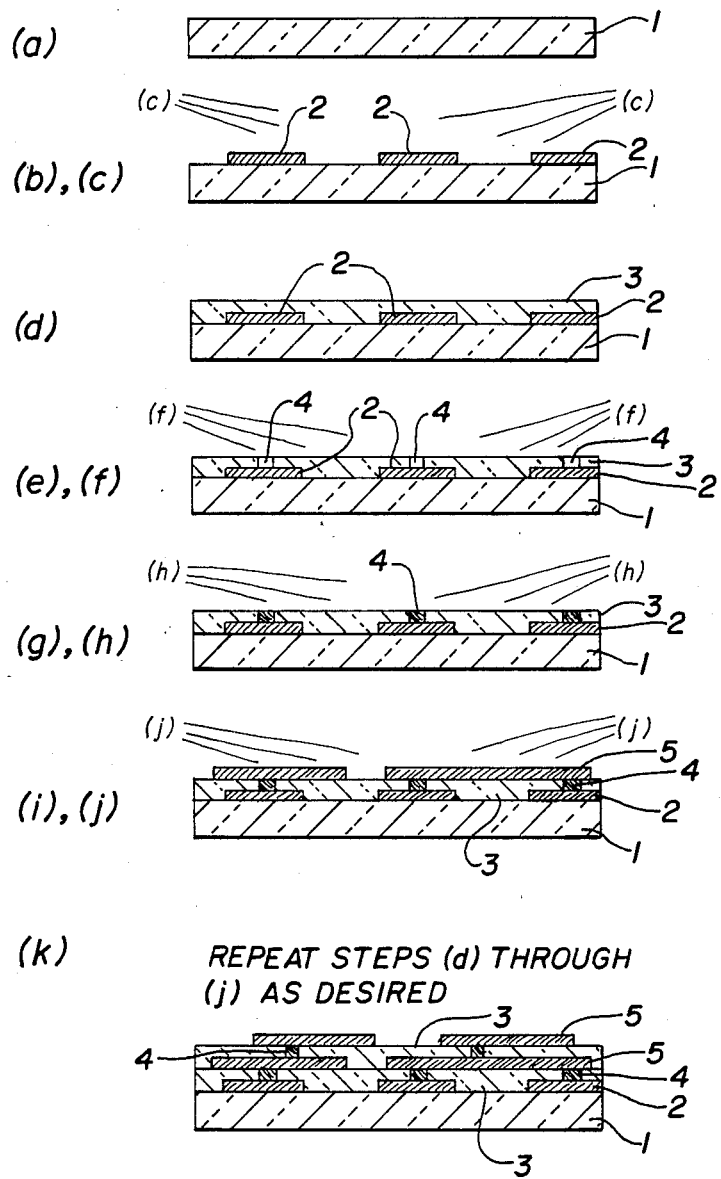

One of the many advantages of the method of the invention is that it can be carried out using conventional thick film conductive materials and dielectric green tapes as well as the conventional techniques for applying these materials to the formation of electrical circuitry.

Thus the conductive layers or metallizations can be formed from conventional thick film conductive pastes comprised of finely divided particles of conductive metal or metal oxide dispersed in an organic medium having appropriate rheology for screen printing application. Such printable thick film pastes may also contain finely divided particles of inorganic binder. After being printed in an appropriate circuit pattern, the conductive thick film layer is fired to effect volatilization of the organic medium and sintering of the solids components.

The intervening insulating (dielectric) layers are formed by laminating in registry with the underlying conductive layers one or more layers of dielectric green tape. Dielectric green tapes are comprised of finely divided dielectric materials such as barium titanate, alumina or glass dispersed in a polymeric matrix which is pyrolyzable when the laminated tape is fired in either an oxidizing or nonoxidizing atmosphere. Upon firing, the polymeric matrix is pyrolyzed (burned out) and the dielectric material is sintered and/or densified.

Such thick film conductor compositions and dielectric green tapes and the methods of applying them are well known in the electronic materials art.

Most frequently, the inorganic substrates used for the invention will be electrically insulative ceramic materials such as alumina and beryllia.

A sine qua non of all substrate materials to be used in the invention is that they must be rigid when formed into thin layers (e.g., 600 microns) and they must be dimensionally stable. That is, they should not undergo any substantial degree of bowing when they are fired and, most importantly, they must possess extreme stability in the X-Y plane. Most frequently, the substrates used for the invention will be made from electrically insulative ceramic materials such as alumina. However, in some instances, substrates can be used which are made from heat-conductive metals or from ceramic-coated metals such as porcelainized steel.

Vias in the green tape layers can be filled by either two methods. In one technique, the vias are filled by screen printing a thick film conductive paste directly into the vias. In another method, the vias are filled during screen printing of an overlying conductive layer by flow of the thick film layer into the vias.

The method of the invention can be used to prepare multilayer circuits containing, for example, 15-20 conductive layers. Green tapes will usually have thicknesses of from about 50 to 400 microns.

DETAILED DESCRIPTION OF THE DRAWING

Referring now to FIG. 1 of the drawing, in step (a), a rigid ceramic substrate 1 made from alumina is provided. In step (b), a patterned conductive layer 2 is provided by screen printing a conductive thick film paste onto the surface of the substrate, and in step (c) it is fired in air at 850° C. Following application and firing of the conductive layer, a layer of dielectric green tape 3 is laminated over the patterned conductive layer 2 and exposed areas of the substrate at a temperature of 50° C. and a pressure of 600 psi for about 10 minutes. In step (e), vias 4 are formed in the green tape 3 by ablation with a laser beam and the green tape 3 is fired at 850° C. in step (f). After firing the green tape 3, the vias 4 in the fired dielectric tape 3 are filled with a conductive metallization in step (g) and fired in step (h). In step (i), a patterned thick film conductive layer 5 is screen printed in registry with the fired vias 4 in the underlying dielectric layer 3 and the conductive layer is fired [step (j)]. When steps (d) through (j) are repeated one time, a multilayer element having three separate conductive layers is formed as shown in the figure [step (k)].

Alternatively, step (f) can be eliminated and the dielectric green tape and the via fills co-fired in step (h).

Alternatively, steps (f) and (h) can be eliminated so as to co-fire the dielectric green tape, the via fills and the overlying conductor metallization in step (j).

Alternatively, step (h) can be eliminated so as to co-fire the via fill metallization with the conductor layer above it in step (j).

During the firing steps, the organic medium from the thick film paste or the polymeric binder from the ceramic green tape is removed by volatilization and the inorganic binder and alumina in the tape are sintered. Using this process, vias are formed in the green tape when the tape is firmly adhered to a rigid substrate, thus preventing flexing and stretching of the tape during the via formation process and improving accuracy of via placement relative to underlying conductor lines. Furthermore, with via formation occurring after the tape dielectric has been laminated to the substrate, the risk of distorting of the via holes during the lamination process is eliminated. Via formation after the tape is laminated can be accomplished by such processes as laser ablation or mechanical trepanning.

In some cases, it may be desirable to begin the processing sequence by laminating dielectric green tape to a rigid substrate before forming the first conductor layer. This would be the case, for example, if an electrically conducting substrate is used. A tape dielectric layer may also be used adjacent to an insulating substrate in cases where it is desired to modify the surface properties of the substrate. For example, although a porcelain enamel coating is electrically insulating, it can react with conductor metallization in such a way that the solderability and solder leach resistance of the conductor is degraded. In such a case, a layer of tape dielectric can be applied to the porcelainized substrate as a base for subsequent conductor metallization. A processing sequence which utilizes a tape dielectric layer as a first step is described hereinbelow.

Figure 2:
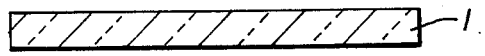
Figure 2:
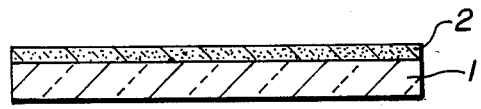
Figure 2:
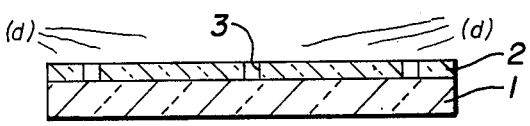
Figure 2:
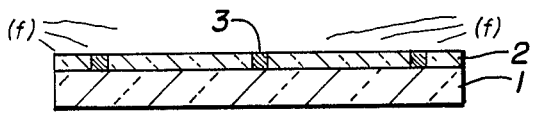
Figure 2:
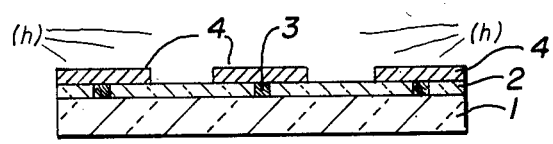
Figure 2:
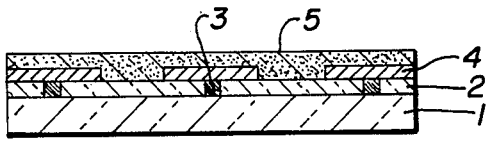
Figure 2:
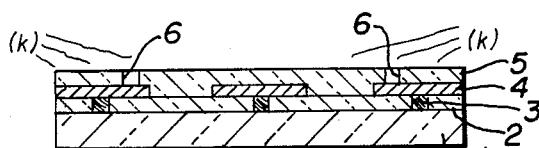
Figure 2:
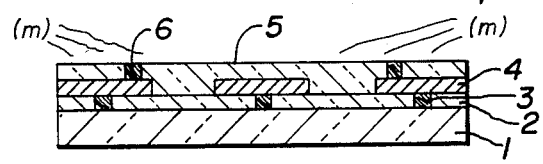
Figure 2:
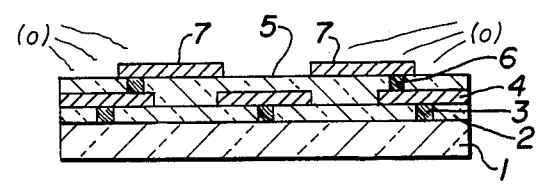
Figure 2:
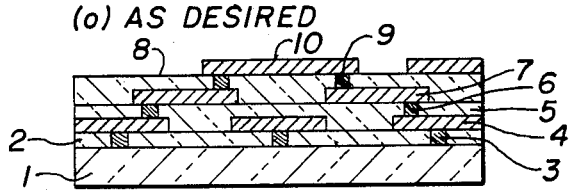

Referring to FIG. 2 of the drawing, in step (a) a rigid ceramic substrate 1 made from alumina is provided. In step (b), a layer of dielectric green tape 2 is laminated over selected areas of the substrate 1 and vias 3 are formed therein by laser ablation [step (c)] and the green tape layer 2 is fired [step (d)]. The vias 3 in the fired dielectric tape layer are then filled with a conductive thick film paste [step (e)] and the filled vias 3 are fired in air at 850° C. [step (f)]. A patterned conductive layer 4 is applied by screen printing a conductive thick film paste onto the exposed surface of the fired dielectric tape layer and the printed conductive layer is fired at 850° C. [steps (g) and (h)]. The filled vias 3 in the dielectric tape layer serve to conduct heat away from the conductive pattern to the underlying substrate 1, which acts as a heat sink when the multilayer system is operational.

Following firing of the conductive layer 4, a layer of dielectric green tape 5 is laminated over the patterned conductive layer 4 and exposed areas of the underlying substrate at a temperature of 50° C. an a pressure of 600 psi for about 10 minutes [step (i)].

After laminating the latter dielectric green tape layer 5, vias 6 are formed therein by laser ablation [step (j)] and the dielectric green tape layer is fired [step (k)]. In step (l), the vias 6 in the fired tape layer 5 are filled with conductive paste and in step (m), the filled vias 6 are fired. A patterned thick film conductive layer 7 is then screen printed over the dielectric layer 5 in registry with the filled vias 6 [step (n)]. The unfired conductive layer 7 is then fired [step (o)]. When steps (i)-(o) are repeated [step (p)] one time, a multilayer element is formed having three separate conductive layers as shown in the figure.

Alternatively, steps (f) and (m) can be eliminated and the via fill conductor and the conductor patterns above it co-fired in steps (h) and (o).

Alternatively, steps (d) and (k) can be eliminated so as to co-fire the tape dielectric with the via fill conductor in steps (f) and (m).

Alternatively, steps (d), (f), (k) and (m) can be eliminated in order to co-fire the dielectric green tape, its via fill metallization and the overlying conductor layer in steps (h) and (o).

I claim:

1. A method for the fabrication of multilayer circuits comprising the sequential steps of:
    (a) providing a dimensionally stable electrically insulative substrate;
    (b) applying to the substrate a patterned conductive layer;
    (c) firing the patterned conductive layer;
    (d) laminating to the fired patterned conductive layer and exposed areas of the substrate a layer of dielectric green tape;
    (e) forming vias in selected positions through the layer of dielectric green tape in registration with the fired patterned conductive layer of step (c);
    (f) firing the laminated dielectric green tape layer;
    (g) filling the vias in the dielectric tape layer with a conductive metallization;
    (h) firing the filled vias in the dielectric tape layer;
    (i) applying a patterned conductive layer to the dielectric tape layer in registry with the vias therein;
    (j) firing the patterned conductive layer; and
    (k) in the event the multilayer circuit requires more than two layers having conductive patterns, repeating the sequence of steps (d) through (j) until the desired number of circuit layers has been obtained.

2. The method of claim 1 in which step (f) is omitted and the laminated dielectric green tape layer and the via fill metallizations are co-fired in step (h).

3. The method of claim 1 in which steps (f) and (h) are eliminated and the dielectric green tape layer, via fill metallizations and overlying patterned conductive layer are co-fired in step (j).

4. The method of claim 1 in which step (h) is omitted and the via fill metallizations and overlying patterned conductive layer are co-fired in step (j).

5. A method for the fabrication of multilayer circuits comprising the sequential steps of:
    (a) providing a dimensionally stable substrate;
    (b) laminating to a surface of the substrate a layer of dielectric green tape;
    (c) optionally forming vias in the laminated green tape;
    (d) firing the laminated dielectric green tape layer;
    (e) filling any vias in the laminated dielectric tape with a conductive metallization;
    (f) firing any filled vias in the dielectric tape layer;

(g) applying to the dielectric tape layer a patterned conductive layer;

(h) firing the patterned conductive layer;

(i) laminating a dielectric green tape layer to the fired patterned conductive layer and exposed areas of the underlying dielectric tape layer;

(j) forming vias in the laminated green tape layer of step (i);

(k) firing the laminated green tape layer which was applied in step (j);

(l) filling the vias in the dielectric tape layer with a conductive metallization;

(m) firing the filled vias contained in the dielectric tape layer from step (1);

(n) applying to the dielectric tape layer a patterned conductive layer;

(o) firing the patterned conductive layer from step (n); and (p) in the event the multilayer circuit requires more than two layers having conductive patterns, repeating the sequence of steps (i) through (o) until the desired number of circuit layers has been obtained.

6. The method of claim 5 in which steps (f) and (m) are omitted and the via fill metallizations and patterned conductive layers are co-fired in steps (h) and (o), respectively.

7. The method of claim 5 in which steps (d) and (k) are omitted and the laminated green tape layers and via fill metallizations are co-fired in steps (f) and (m), respectively.

8. The method of claim 5 in which steps (d), (f), (k) and (m) are omitted and the laminated green tape layers, via fill metallizations and patterned conductive layers are co-fired in steps (h) and (o), respectively.

* * * * *